United States Patent
Wang et al.

(10) Patent No.: US 9,972,261 B2
(45) Date of Patent: May 15, 2018

(54) LIQUID CRYSTAL DISPLAY DEVICE AND GOA CIRCUIT

(71) Applicant: SHENZHEN CHINA STAR OPTOELECTRONICS TECHNOLOGY CO. LTD., Guangdong (CN)

(72) Inventors: Xiaoxiao Wang, Guangdong (CN); Peng Du, Guangdong (CN)

(73) Assignee: SHENZHEN CHINA STAR OPTOELECTRONICS TECHNOLOGY CO. LTD., Guangdong (CN)

(*) Notice: Subject to any disclaimer, the term of this patent is extended or adjusted under 35 U.S.C. 154(b) by 64 days.

(21) Appl. No.: 14/907,825

(22) PCT Filed: Jan. 11, 2016

(86) PCT No.: PCT/CN2016/070600
§ 371 (c)(1),
(2) Date: Jan. 27, 2016

(87) PCT Pub. No.: WO2017/107255
PCT Pub. Date: Jun. 29, 2017

(65) Prior Publication Data
US 2017/0186387 A1    Jun. 29, 2017

(30) Foreign Application Priority Data
Dec. 24, 2015  (CN) .......................... 2015 1 0990552

(51) Int. Cl.
G06F 3/038    (2013.01)
G09G 5/00    (2006.01)
G09G 3/36    (2006.01)

(52) U.S. Cl.
CPC ... *G09G 3/3648* (2013.01); *G09G 2300/0452* (2013.01); *G09G 2310/0251* (2013.01); *G09G 2320/0242* (2013.01)

(58) Field of Classification Search
None
See application file for complete search history.

(56) References Cited

U.S. PATENT DOCUMENTS 6,300,928 B1    10/2001    Kim
2010/0238143 A1*    9/2010    Liu .......................... G09G 3/20
                                                                    345/204
(Continued)

FOREIGN PATENT DOCUMENTS

CN    103680451 A    3/2014
CN    103928007 A    7/2014
(Continued)

OTHER PUBLICATIONS

Merriam-Webster online dictionary definition of sustain, https://www.merriam-webster.com/dictionary/sustain, p. 1.*

*Primary Examiner* — Kumar Patel
*Assistant Examiner* — Kirk Hermann
(74) *Attorney, Agent, or Firm* — Mark M. Friedman

(57) ABSTRACT

A GOA (Gate driver On Array) for an LCD (Liquid Crystal Display) device is disclosed herein. The LCD device comprises a plurality of scanning lines. The GOA circuit comprises a plurality of GOA units, which are cascaded with each other as a plurality of level GOA units. The (n)th level GOA unit comprises a clock circuit, a pull-down circuit, a bootstrap capacitor circuit, a pull-up circuit, and a pull-down sustain circuit, to improve the color shift issue of a Tri-gate.

13 Claims, 5 Drawing Sheets

(56) References Cited

U.S. PATENT DOCUMENTS

| | | | |
|---|---|---|---|
| 2012/0093276 A1* | 4/2012 | Wang | ............... G11C 19/28 377/78 |
| 2015/0279289 A1 | 10/2015 | Yu et al. | |
| 2016/0125824 A1 | 5/2016 | Dai | |
| 2016/0275886 A1 | 9/2016 | Dai | |
| 2017/0032750 A1* | 2/2017 | Shao | ............... G09G 3/3648 |

FOREIGN PATENT DOCUMENTS

| | | |
|---|---|---|
| CN | 104036751 A | 9/2014 |
| CN | 104299591 A | 1/2015 |

* cited by examiner

LIQUID CRYSTAL DISPLAY DEVICE AND GOA CIRCUIT

BACKGROUND OF THE INVENTION

Field of Invention

The present invention relates to the field of liquid crystal display (LCD) technology, and more particularly to a GOA (Gate driver On Array) circuit for an LCD device.

Description of Prior Art

In the present manufacture of a liquid crystal panel, lowering the cost and raising the quality are key points to enhance the core competitive strength of the liquid display panel. A "Tri-gate" is a usual method to lower the cost. In this method, all pixels are rotated by 90 degrees, gate lines are tripled, and the number of data lines is reduced to one-third compared to the original amount. The costs of data chips are higher. Accordingly, the usage amount of the data chips is reduced by using the above method, so as to achieve the goal of reducing the cost.

The number of COFs (chip on films) at a side where the data chip resides is decreased, and the wirings in the fanout region where the data chip resides are lengthened. Hence, the RC (resistance capacitance) delay becomes more serious. Data signals at two edges of a panel are distorted the most seriously due to having the greatest RC delay. The two edges of the panel are poorly charged, and a color shift issue occurs at the two edges of the panel.

Refer to FIGS. 1, 2a, and 2b. FIG. 1 is a structural illustrative drawing of a display area of an LCD device 10 of the prior art. FIG. 2a is a first schematic drawing showing an actual displaying of the display area of FIG. 1. FIG. 2b is a second schematic drawing showing what is actually displayed in the display area of FIG. 1. The display area comprises a plurality of pixel columns which are arrayed in an order of red, green, and blue. For example, in the case that a pure yellow color image is displayed with a gray value 255 (hereinafter "L255"), in FIG. 2a, the red pixel columns and the green pixel columns are needed to be turned on to a brightness of L255. If the red pixel columns are turned on first, and then the green pixel columns are turned on, the data signals for driving the red pixel columns G(1), G(4) are distorted. As a result, the red pixel columns are charged insufficiently, and the brightness of L255 is unable to be achieved. Two edges of the yellow image obtained will have a green tone. In FIG. 2a, if the green pixel columns are turned on first, and then the red pixel columns are turned on, the data signals for driving the green pixel columns G(2), G(5) are distorted. As a result, the green pixel columns are charged insufficiently. The two edges of the yellow image will have a red tone.

So there is a need to provide an LCD device and a GOA circuit to solve the technical problem above.

SUMMARY OF THE INVENTION

An objective of the present invention is to provide a GOA circuit for an LCD device.

To achieve the above purpose, the present invention provides a GOA circuit for an LCD device. The LCD device comprises a plurality of scanning lines. The GOA circuit comprises a plurality of GOA units, which are cascaded with each other as multiple levels GOA units. The (n)th level GOA unit comprises a clock circuit, a pull-down circuit, a bootstrap capacitor circuit, a pull-up circuit, and a pull-down sustain circuit.

The clock circuit receives an (m)th level clock signal of a plurality of level clock signals, and to connect with an (n)th level starting signal and an (n)th level scanning line of the scanning lines. The pull-down circuit connects with a gate signal point, the (n)th level scanning line, an (n+2)nd level scanning line of the plurality of scanning lines, an (n+2)nd level starting signal and a constant voltage source. The bootstrap capacitor circuit connects with the gate signal point and the constant voltage source. The pull-up circuit connects with the gate signal point, an (n−2)nd level scanning line of the plurality of scanning lines, and an (n−2)nd level starting signal. The pull-down sustain circuit connects with the gate signal point, the constant voltage source, and the (n)th level scanning line. The numeral m and the numeral n are positive integers.

In one preferred embodiment, the clock circuit comprises a first transistor and a second transistor.

A control terminal of the first transistor connects with the gate signal point, an input terminal of the first transistor receives the (m)th level clock signal, and an output terminal of the first transistor connects with the (n)th level scanning line.

A control terminal of the second transistor connects with the gate signal point, an input terminal of the second transistor connects with the input terminal of the first transistor, and an output terminal of the second transistor connects with the (n)th level starting signal.

In one preferred embodiment, each of the plurality of level clock signals has the same duty cycle.

In one preferred embodiment, the pull-down circuit comprises a third transistor and a fourth transistor.

A control terminal of the third transistor connects with the (n+2)nd level scanning line and the (n+2)nd level starting signal, an input terminal of the third transistor connects with the constant voltage source, and an output terminal of the third transistor connects with the (n)th level scanning line.

A control terminal of the fourth transistor connect with the (n+2)nd level scanning line and the (n+2)nd level starting signal, an input terminal of the fourth transistor connects with the constant voltage source, and an output terminal of the fourth transistor connects with the gate signal point.

In one preferred embodiment, the bootstrap capacitor circuit comprises a first capacitor, and the first capacitor has two terminals which are connected with the gate signal point and the (n)th level scanning line.

In one preferred embodiment, the pull-up circuit comprises a fifth transistor. A control terminal of the fifth transistor connects with the (n−2)nd level scanning line and the (n−2)nd level starting signal, an input terminal of the fifth transistor connects with the control terminal of the fifth transistor, an output terminal of the fifth transistor connects with the gate signal point.

In one preferred embodiment, the pull-down sustain circuit comprises a first pull-down sustain circuit and a second pull-down sustain circuit.

The first pull-down sustain circuit comprises a sixth transistor, a seventh transistor, and an eighth transistor.

An input terminal of the sixth transistor connects with the constant voltage source, and an output terminal of the sixth transistor connects with the gate signal point. A control terminal of the seventh transistor receives a first low-frequency signal, and an output terminal of the seventh transistor connects with the control terminal of the seventh transistor. A control terminal of the eighth transistor connects with the gate signal point, and an input terminal of the eighth transistor connects with the constant voltage source.

The second pull-down sustain circuit comprises a ninth transistor, a tenth transistor, and an eleventh transistor.

An input terminal of the ninth transistor connects with the constant voltage source, an output terminal of the ninth transistor connects with the gate signal point. A control terminal of the tenth transistor receives a second low-frequency signal, an output terminal of the tenth transistor connects with the control terminal of the tenth transistor. A control terminal of the eleventh transistor connects with the gate signal point, and an input terminal of the eleventh transistor connects with the constant voltage source.

In one preferred embodiment, the first low-frequency signal and the second frequency signal are reversed.

In one preferred embodiment, the first low-frequency signal and the second frequency signal exchange directions every 100 frames.

In one preferred embodiment, an LCD device comprises the GOA circuit as above.

The present invention replaces the traditional gate chips with the GOA circuit by designing the driving method of the GOA circuit to improve the color shift issue of Tri-gate; meanwhile, the manufacturing cost is further lowered by replacing the gate chips by the GOA circuit.

BRIEF DESCRIPTION OF THE DRAWINGS

Figure 1:
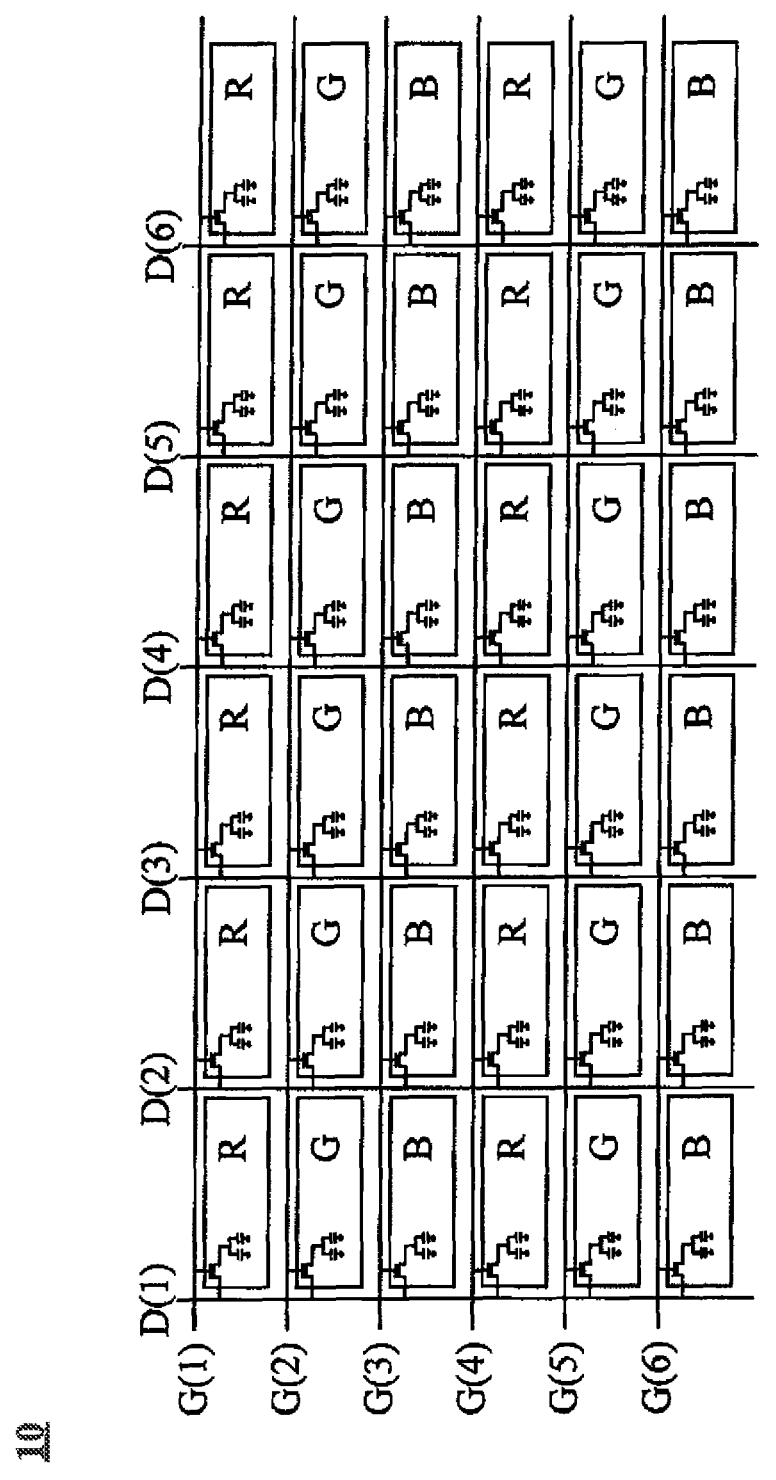

FIG. 1 is a structural illustrative drawing of a display area of a LCD device of the prior art;

FIG. 3 is a structural illustrative drawing of a display area of a LCD device of the present invention;

DETAILED DESCRIPTION OF THE PREFERRED EMBODIMENTS

Figure 2A:
FIG. 2a is a first schematic drawing showing a displaying of the display area of FIG. 1.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, units with similar structures are marked with the same labels.

Figure 3:
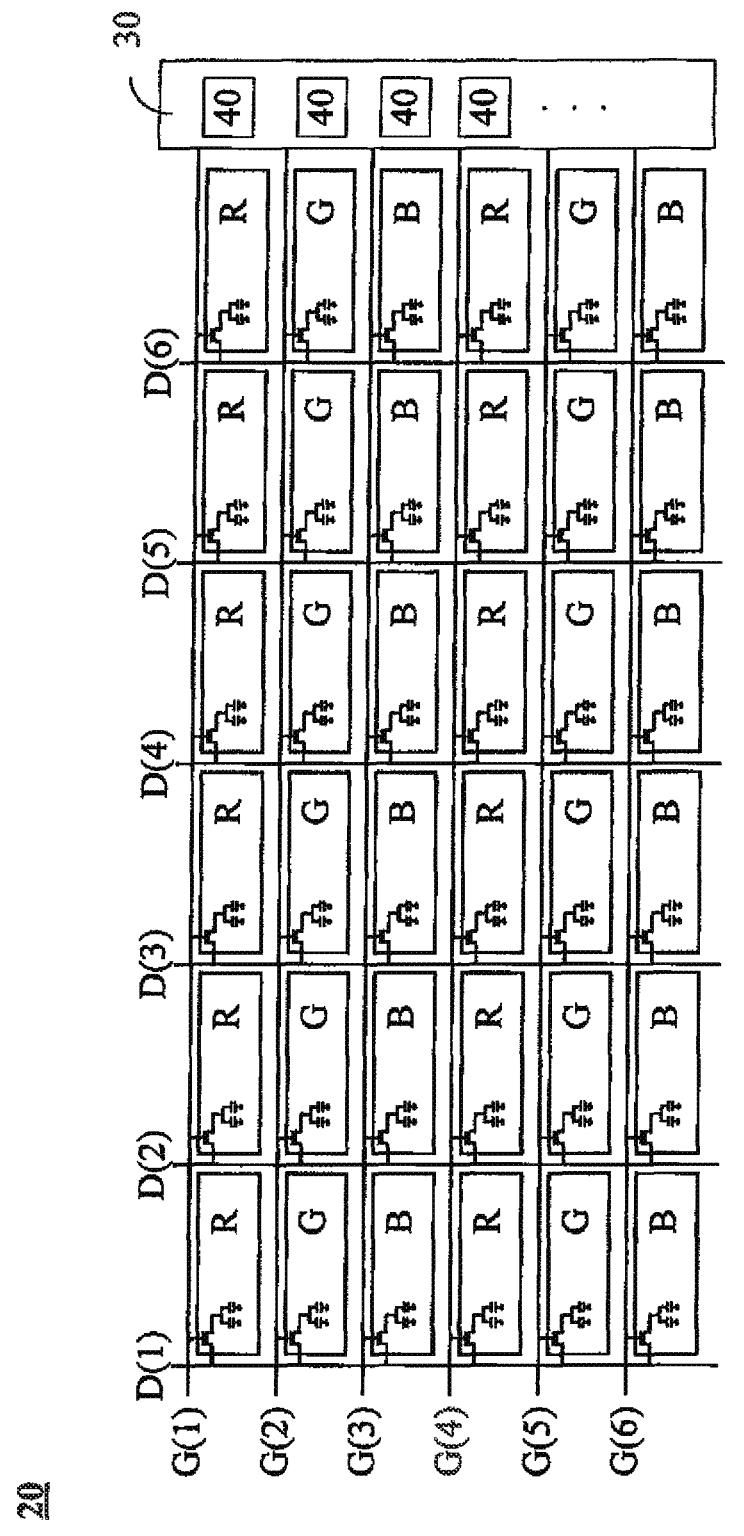

FIG. 3 is a structural illustrative drawing of a display area of a LCD device 20 of the present invention. The LCD device 20 comprises a plurality of data lines (D1-D6), a plurality of scanning lines (G1-G6), and a GOA circuit 30. The display area comprises a plurality of pixel columns which are arrayed by red, green, and blue. The LCD device 20 uses the GOA circuit 30 to provide scanning signals to the plurality of scanning lines (G1-G6). The GOA circuit 30 comprises a plurality of cascaded GOA units 40.

Figure 4:
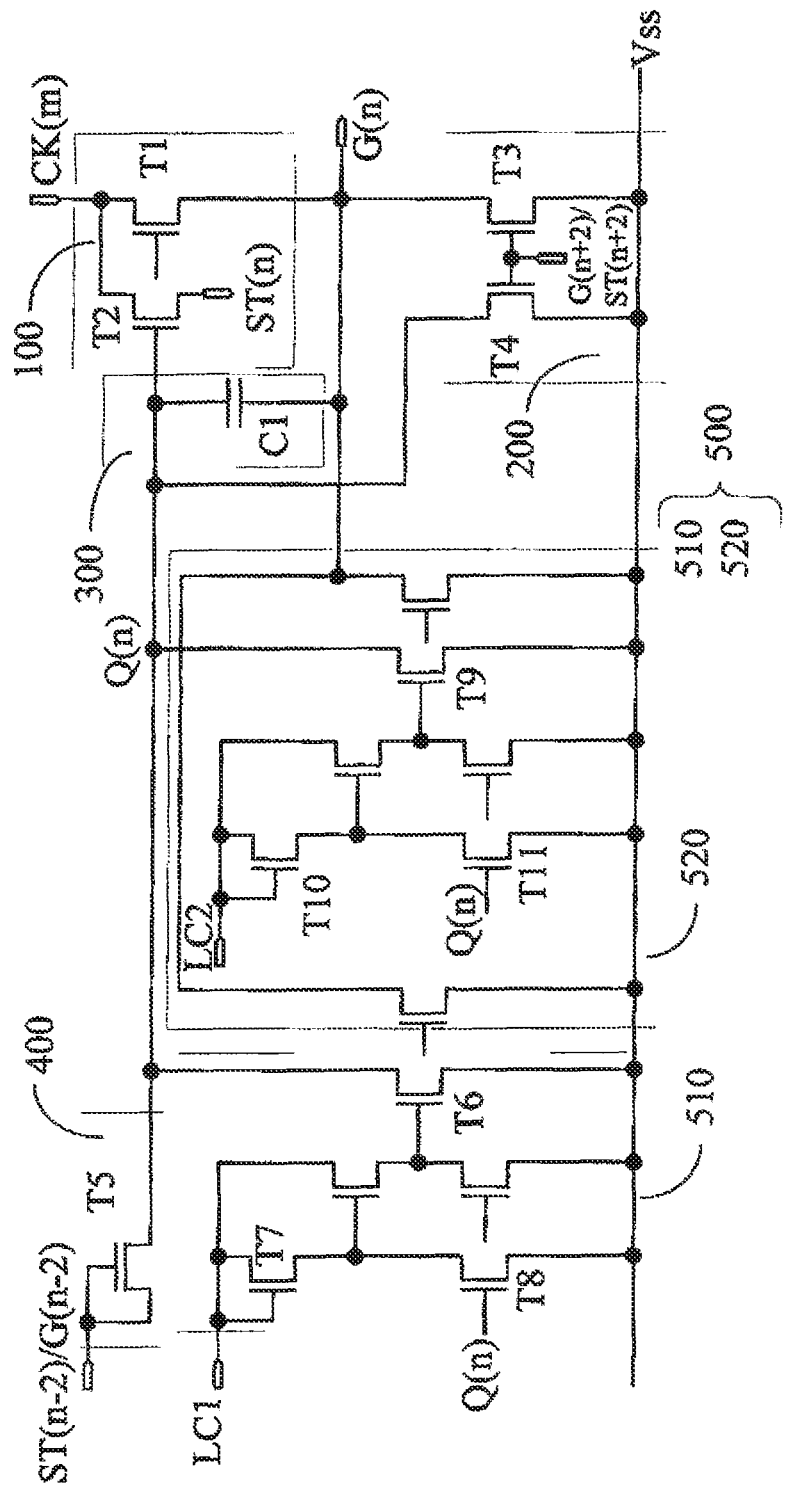
FIG. 4 is an illustrative drawing of the GOA unit of the LCD device of the present invention.

FIG. 4 is an illustrative drawing of the GOA unit 40 of the LCD device 20 of the present invention. This drawing takes an (n)th level GOA unit 40 as an example. The (n)th level GOA unit 40 comprises a clock circuit 100, a pull-down circuit 200, a bootstrap capacitor circuit 300, a pull-up circuit 400, and a pull-down sustain circuit 500.

The clock circuit 100 is used to receive an (m)th level clock signal CKm of a plurality of level clock signals, and to connect with an (n)th level starting signal ST(n) and an (n)th level scanning line G(n) of the scanning lines. The pull-down circuit 200 connects with a gate signal point Q(n), the (n)th level scanning line G(n), an (n+2)nd level scanning line G(n+2) of the plurality of scanning lines, a (n+2)nd level starting signal ST(n+2) and a constant voltage source Vss. The bootstrap capacitor circuit 300 connects with the gate signal point Q(n) and the constant voltage source Vss. The pull-up circuit 400 connects with the gate signal point Q(n), an (n−2)nd level scanning line G(n−2) of the plurality of scanning lines, and an (n−2)nd level starting signal ST(n−2). The pull-down sustain circuit 500 connects with the gate signal point Q(n), the constant voltage source Vss, and the (n)th level scanning line G(n). The numeral m and the numeral n are positive integers. Generally, the numeral m is less than or equal to the numeral n.

The clock circuit 100 comprises a first transistor T1 and a second transistor T2.

A control terminal of the first transistor T1 connects with the gate signal point Q(n), an input terminal of the first transistor T1 receives the (m)th level clock signal CKm, an output terminal of the first transistor T1 connects with the (n)th level scanning line. G(n).

A control terminal of the second transistor T2 connects with the gate signal point Q(n), an input terminal of the second transistor T2 connects with the input terminal of the first transistor T1, an output terminal of the second transistor T2 connects with the (n)th level starting signal ST(n).

The pull-down circuit 200 comprises a third transistor T3 and a fourth transistor T4.

A control terminal of the third transistor T3 connects with the (n+2)nd level scanning line G(n−2) and the (n+2)nd level starting signal ST(n+2), an input terminal of the third transistor T3 connects with the constant voltage source Vss, an output terminal of the third transistor T3 connects with the (n)th level scanning line G(n).

A control terminal of the fourth transistor T4 connect with the (n+2)nd level scanning line G(n+2) and the (n+2)nd level starting signal ST(n+2), an input terminal of the fourth transistor T4 connects with the constant voltage source Vss, an output terminal of the fourth transistor T4 connects with the gate signal point Q(n).

The bootstrap capacitor circuit 300 comprises a first capacitor C1. The first capacitor C1 has two terminals which are connected with the gate signal point Q(n) and the (n)th level scanning line G(n).

The pull-up circuit 400 comprises a fifth transistor T5. A control terminal of the fifth transistor T5 connects with the (n−2)nd level scanning line G(n−2) and the (n−2)nd level starting signal ST(n−2), an input terminal of the fifth transistor T5 connects with the control terminal of the fifth transistor T5, an output terminal of the fifth transistor T5 connects with the gate signal point Q(n).

The pull-down sustain circuit 500 comprises a first pull-down sustain circuit 510 and a second pull-down sustain circuit 520.

The first pull-down sustain circuit 510 comprises a sixth transistor T6, a seventh transistor T7, and an eighth transistor T8.

An input terminal of the sixth transistor T6 connects with the constant voltage source Vss, an output terminal of the sixth transistor T6 connects with the gate signal point Q(n). A control terminal of the seventh transistor T7 receives a first low-frequency signal LC1, an output terminal of the seventh transistor T7 connects with the control terminal of the seventh transistor T7. A control terminal of the eighth transistor T8 connects with the gate signal point Q(n), an input terminal of the eighth transistor T8 connects with the constant voltage source Vss.

The second pull-down sustain circuit 520 comprises a ninth transistor T9, a tenth transistor T10, an a eleventh transistor T11.

An input terminal of the ninth transistor T9 connects with the constant voltage source Vss, an output terminal of the ninth transistor T9 connects with the gate signal point Q(n). A control terminal of the tenth transistor T10 receives a second low-frequency signal LC2, an output terminal of the tenth transistor T10 connects with the control terminal of the tenth transistor T10. A control terminal of the eleventh transistor T11 connects with the gate signal point Q(n), an input terminal of the eleventh transistor T11 connects with the constant voltage source Vss.

Preferably, the first low-frequency signal LC1 and the second frequency signal LC2 are reversed signals and work alternatively to ensure the stability of the gate signal point Q(n) and the (n)th level scanning line G(n). The output of the (n−2)nd level scanning line G(n−2) connects with the (n−2) nd level starting signal, which are used to pull up the potential of the gate signal point Q(n). In the pre-charge situation, the (n+2)nd level scanning line G(n+2) is helping to pull down the (n)th level scanning line G(n) and the gate signal point Q(n).

Figure 2B:
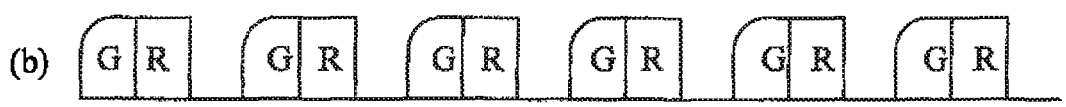
FIG. 2b is a second schematic drawing showing a displaying of the display area of FIG. 1.
Figure 5:
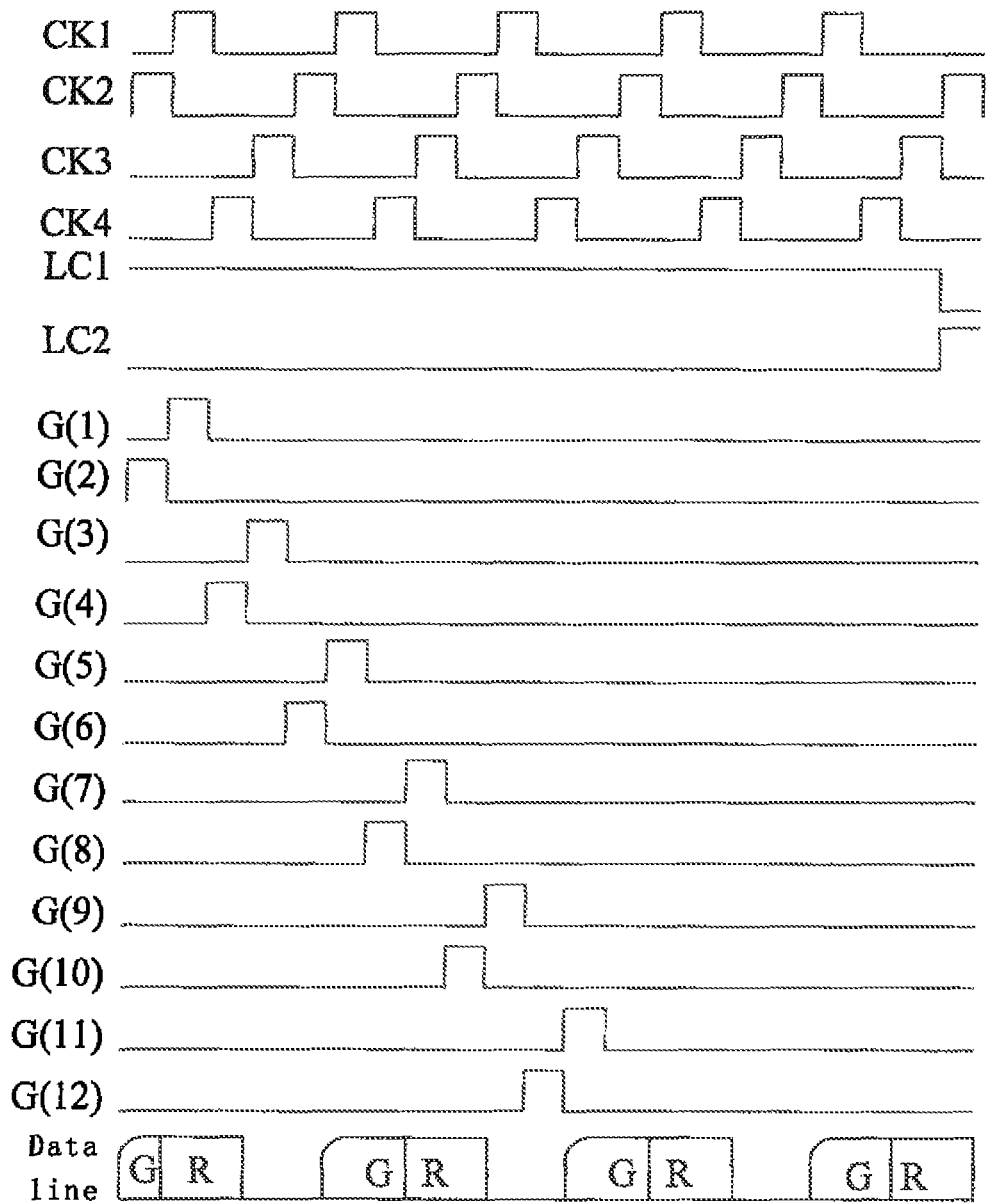
FIG. 5 is an actual display drawing of the GOA circuit of FIG. 4 in the display area of FIG. 3.

FIG. 5 is an actual display drawing of the GOA unit 40 of FIG. 4 in the display area of FIG. 3. With designing different clock signals, the color shift issue of Tri-gate is improved and the advantage of reduced costs is achieved. Preferably, the duty cycles of the plurality of clock signals are equal to each other with no overlapping. In the preferred embodiment, the numeral m is assumed to be 4, in other words, there are 4 clock signals (CK1-CK4), in every period, the duty cycles of the 4 clock signals (CK1-CK4) do not overlap with each other; the numeral n is assumed to be 12, in other words, there are 12 pixel columns. The duty cycles of the clock signals (CK1-CK4) are set as 25%, while scanning the (n−2)nd pixel column, the (n−2)nd level GOA unit outputs by the (n−2)nd level starting signal ST(n−2), the (n−2)nd level starting signal ST(n−2) connects with the (n)th level GOA unit to pull up the gate signal point Q(n) of the (n)th level GOA unit; while the (m)th level clock signal CKm turns on, the (n)th level GOA unit starts to output a gate wave; while the (n+2)nd GOA unit starts to output, the (n+2)nd level scanning line G(n+2) and the (n+2)nd level starting signal ST(n+2) of the (n+2)nd GOA unit will pull down the potential of the gate signal point Q(n) and the (n)th level scanning line G(n). The actual operation steps are as follows:

Turn on the first level GOA unit, the potential of the gate signal point of the third level GOA unit is pulled up; while the third level GOA unit is turned on, the output of the first level GOA unit will be pulled down to the low potential by the third level GOA unit, in other words, the first level scanning line G(1) turns off; while the third level GOA unit is turned on, the gate signal point of the fifth level GOA unit will be pulled up; while the fifth GOA unit is turned on, the output of the third level GOA unit will be pulled down to the low potential by the fifth level GOA unit, the other level GOA units of the GOA circuit will perform like the above. In the preferred embodiment, The first, the fifth, and the ninth level GOA units 40 assort with the first level clock signal CK1; the second, the sixth, and the tenth level GOA units 40 assort with the second level clock signal CK2; the third, seventh, and the eleventh level GOA units 40 assort with the third level clock signal CK3; the fourth, eighth, and the twelfth level GOA units 40 assort with the fourth level clock signal CK4. Preferably, the first low-frequency signal LC1 and the second frequency signal LC2 exchange directions every 100 frames. While scanning the (n−2)nd pixel column, the (n)th pixel column is scanned at the same time; while scanning the (n+2)nd pixel column, the (n)th pixel column turns off. For example, in the preferred embodiment, While scanning the first pixel column G(1), the third pixel column G(3) is scanned at the same time; while scanning the fifth pixel column G(5), the third pixel column G(3) turns off. We also take a yellow image with L255 for example, the arrangement of the pixels in the vertical direction is repeated by RGB (red, green, and blue). From the output signal of the data line, we can see that the green pixels G with no sufficient charge are decreased to half that of the prior art (please refer to FIG. 2b), hence, the color shift is improved effectively.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A GOA (Gate driver On Array) circuit for an LCD (Liquid Crystal Display) device, the LCD device comprises a plurality of scanning lines, the GOA circuit comprising:
   a plurality of GOA units, being cascaded with each other as multiple levels of GOA units, the (n)th level GOA unit comprising:
      a clock circuit for receiving an (m)th level clock signal of a plurality of level clock signals, and being connected with an (n)th level starting signal and an (n)th level scanning line of the scanning lines;
      a pull-down circuit being connected with a gate signal point, the (n)th level scanning line, an (n+2)nd level scanning line of the plurality of scanning lines, an (n+2)nd level starting signal and a constant voltage source;
      a bootstrap capacitor circuit for connecting with the gate signal point and the constant voltage source;
      a pull-up circuit for connecting with the gate signal point, an (n−2)nd level scanning line of the plurality of scanning lines, and an (n−2)nd level starting signal;
      a pull-down sustain circuit for connecting with the gate signal point, the constant voltage source, and the (n)th level scanning line;
   wherein the numeral m and the numeral n are integers, the clock circuit comprises a first transistor, a control terminal of the first transistor is connected with the gate signal point, an input terminal of the first transistor receives the (m)th level clock signal, an output terminal of the first transistor is connected with the (n)th level scanning line, the pull-down circuit comprises a third transistor, a control terminal of the third transistor is connected with the (n+2)nd level scanning line and the (n+2)nd level starting signal, an input terminal of the third transistor is connected with the constant voltage source, an output terminal of the third transistor is connected with the (n)th level scanning line;

wherein the pull-up circuit comprises:
a fifth transistor, a control terminal of the fifth transistor is directly connected with the (n−2)nd level scanning line and the (n−2)nd level starting signal, an input terminal of the fifth transistor is connected with the control terminal of the fifth transistor, an output terminal of the fifth transistor is connected with the gate signal point; wherein the pull-down sustain circuit comprises a first pull-down sustain circuit and a second pull-down sustain circuit;
wherein the first pull-down sustain circuit comprises:
a sixth transistor, an input terminal of the sixth transistor connects with the constant voltage source, an output terminal of the sixth transistor connects with the gate signal point;
a seventh transistor, a control terminal of the seventh transistor receives a first low-frequency signal, an output terminal of the seventh transistor connects with the control terminal of the seventh transistor; and
an eighth transistor, a control terminal of the eighth transistor connects with the gate signal point, an input terminal of the eighth transistor connects with the constant voltage source;
the second pull-down sustain circuit comprises:
a ninth transistor, an input terminal of the ninth transistor connects with the constant voltage source, an output terminal of the ninth transistor connects with the gate signal point;
a tenth transistor, a control terminal of the tenth transistor receives a second low-frequency signal, an output terminal of the tenth transistor connects with the control terminal of the tenth transistor; and
an eleventh transistor, a control terminal of the eleventh transistor connects with the gate signal point, an input terminal of the eleventh transistor connects with the constant voltage source;
wherein the first low-frequency signal and the second frequency signal exchange directions every 100 frames.

2. The GOA circuit for the LCD device according to claim 1, wherein the clock circuit comprises:
a second transistor, a control terminal of the second transistor connects with the gate signal point, an input terminal of the second transistor connects with the input terminal of the first transistor, an output terminal of the second transistor connects with the (n)th level starting signal.

3. The GOA circuit for the LCD device according to claim 1, wherein each of the plurality of level clock signals has the same duty cycle.

4. The GOA circuit for the LCD device according to claim 1, wherein the pull-down circuit comprises:
a fourth transistor, a control terminal of the fourth transistor connects with the (n+2)nd level scanning line and the (n+2)nd level starting signal, an input terminal of the fourth transistor connects with the constant voltage source, an output terminal of the fourth transistor connects with the gate signal point.

5. The GOA circuit for the LCD device according to claim 1, wherein the bootstrap capacitor circuit comprises:
a first capacitor having two terminals which are connected with the gate signal point and the (n)th level scanning line.

6. The GOA circuit for the LCD device according to claim 1, wherein the first low-frequency signal and the second frequency signal are reversed.

7. A GOA (Gate driver On Array) circuit for an LCD (Liquid Crystal Display) device, the LCD device comprises a plurality of scanning lines, the GOA circuit comprising:
a plurality of GOA units, being cascaded to each other as multiple levels of GOA units, the nth level GOA unit comprising:
a clock circuit for receiving an (m)th level clock signal of a plurality of level clock signals, and being connected with an nth level starting signal and an nth level scanning line of the scanning lines;
a pull-down circuit being connected with a gate signal point, the (n)th level scanning line, an (n+2)nd level scanning line of the plurality of scanning lines, an (n+2)nd level starting signal and a constant voltage source;
a bootstrap capacitor circuit for connecting with the gate signal point and the constant voltage source;
a pull-up circuit for connecting with the gate signal point, an (n−2)nd level scanning line of the plurality of scanning lines, and an (n−2)nd level starting signal;
a pull-down sustain circuit for connecting with the gate signal point, the constant voltage source, and the (n)th level scanning line;
wherein the numeral m and the numeral n are integers;
wherein the pull-up circuit comprises:
a fifth transistor, a control terminal of the fifth transistor is directly connected with the (n−2)nd level scanning line and the (n−2)nd level starting signal, an input terminal of the fifth transistor is connected with the control terminal of the fifth transistor, an output terminal of the fifth transistor is connected with the gate signal point;
wherein the pull-down sustain circuit comprises a first pull-down sustain circuit and a second pull-down sustain circuit;
the first pull-down sustain circuit comprises:
a sixth transistor, an input terminal of the sixth transistor connects with the constant voltage source, an output terminal of the sixth transistor connects with the gate signal point;
a seventh transistor, a control terminal of the seventh transistor receives a first low-frequency signal, an output terminal of the seventh transistor connects with the control terminal of the seventh transistor; and
an eighth transistor, a control terminal of the eighth transistor connects with the gate signal point, an input terminal of the eighth transistor connects with the constant voltage source;
the second pull-down sustain circuit comprises:
a ninth transistor, an input terminal of the ninth transistor connects with the constant voltage source, an output terminal of the ninth transistor connects with the gate signal point;
a tenth transistor, a control terminal of the tenth transistor receives a second low-frequency signal, an output terminal of the tenth transistor connects with the control terminal of the tenth transistor; and
an eleventh transistor, a control terminal of the eleventh transistor connects with the gate signal point, an input terminal of the eleventh transistor connects with the constant voltage source;
wherein the first low-frequency signal and the second frequency signal exchange directions every 100 frames.

8. The GOA circuit for the LCD device according to claim 7, wherein the clock circuit comprises:
   a first transistor, a control terminal of the first transistor connects with the gate signal point, an input terminal of the first transistor receives the (m)th level clock signal, an output terminal of the first transistor connects with the (n)th level scanning line; and
   a second transistor, a control terminal of the second transistor connects with the gate signal point, an input terminal of the second transistor connects with the input terminal of the first transistor, an output terminal of the second transistor connects with the (n)th level starting signal.

9. The GOA circuit for the LCD device according to claim 7, wherein each of the plurality of level clock signals has the same duty cycle.

10. The GOA circuit for the LCD device according to claim 7, wherein the pull-down circuit comprises:
   a third transistor, a control terminal of the third transistor connects with the (n+2)nd level scanning line and the (n+2)nd level starting signal, an input terminal of the third transistor connects with the constant voltage source, an output terminal of the third transistor connects with the (n)th level scanning line; and
   a fourth transistor, a control terminal of the fourth transistor connect with the (n+2)nd level scanning line and the (n+2)nd level starting signal, an input terminal of the fourth transistor connects with the constant voltage source, an output terminal of the fourth transistor connects with the gate signal point.

11. The GOA circuit for the LCD device according to claim 7, wherein the bootstrap capacitor circuit comprises:
   a first capacitor having two terminals which are connected with the gate signal point and the (n)th level scanning line.

12. The GOA circuit for the LCD device according to claim 7, wherein the first low-frequency signal and the second frequency signal are reversed.

13. An LCD device, which comprises the GOA circuit of claim 7.

* * * * *